United States Patent
Moon et al.

(10) Patent No.: US 7,773,372 B2
(45) Date of Patent: Aug. 10, 2010

(54) ORGANIC LIGHT EMITTING DIODE DISPLAY

(75) Inventors: Chan-Kyoung Moon, Suwon-si (KR); Kuen-Dong Ha, Suwon-si (KR); Ji-Ho Kang, Suwon-si (KR); Hyun-Hee Lee, Suwon-si (KR); Dong-Su Yee, Suwon-si (KR); Jung-Jun Im, Suwon-si (KR); Oh-June Kwon, Suwon-si (KR); Hyun-Min Hwang, Suwon-si (KR); Mun-Su Kim, Suwon-si (KR); Seung-Won Chegal, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 180 days.

(21) Appl. No.: 12/222,867

(22) Filed: Aug. 18, 2008

(65) Prior Publication Data
US 2009/0168318 A1 Jul. 2, 2009

(30) Foreign Application Priority Data
Dec. 27, 2007 (KR) .................. 10-2007-0139025

(51) Int. Cl.
*G06F 1/16* (2006.01)
(52) U.S. Cl. ............... 361/679.21; 349/58; 313/504; 345/208; 362/480
(58) Field of Classification Search ............ 349/58, 349/64, 141, 122; 361/679.21, 679.55, 679.26, 361/679.01, 679.36, 679.27, 679.02, 679.33, 361/679.41; 313/49, 504, 512; 345/173, 345/178, 169, 208, 76, 104; 463/34, 20, 463/30, 36; 362/97.1, 480, 503
See application file for complete search history.

(56) References Cited

U.S. PATENT DOCUMENTS

2008/0165303 A1 * 7/2008 Jung et al. .................. 349/58

(Continued)

FOREIGN PATENT DOCUMENTS

JP 2002-215051 7/2002

(Continued)

OTHER PUBLICATIONS

Office action from Japanese Patent Office issued in Applicant's corresponding Japanese Patent Application No. 2008-105887 dated Jan. 19, 2010, and Request for Entry of the Accompanying Office Action for the Japanese Office action attached herewith.

(Continued)

*Primary Examiner*—Hung V Duong
(74) *Attorney, Agent, or Firm*—Robert E. Bushnell, Esq.

(57) ABSTRACT

An organic light emitting diode (OLED) display has an increased mechanical strength by improving the shape of a bezel combined to a panel assembly. The OLED display includes a panel assembly having a display area and a pad area, and a bezel accommodating the panel assembly. The bezel includes a bottom part on which the panel assembly is mounted, a side wall provided on a side of the bezel, and a hemming flange provided at another side of the bezel on which the side wall is not provided. The panel assembly is mounted in a manner that the pad area is turned towards the another side.

15 Claims, 9 Drawing Sheets

U.S. PATENT DOCUMENTS

| | | | |
|---|---|---|---|
| 2008/0165304 A1* | 7/2008 | Jung | 349/58 |
| 2009/0179557 A1* | 7/2009 | Yee et al. | 313/504 |
| 2009/0195973 A1* | 8/2009 | Yee et al. | 361/679.21 |

FOREIGN PATENT DOCUMENTS

| | | |
|---|---|---|
| JP | 2004-045459 | 2/2004 |
| JP | 2004-259656 | 9/2004 |
| JP | 2006-133651 | 5/2006 |
| JP | 2006-157487 | 6/2006 |
| JP | 2006-209037 | 8/2006 |
| JP | 2006-215516 | 8/2006 |
| JP | 2007-033565 | 2/2007 |
| JP | 2007-199106 | 8/2007 |
| KR | 10-2000-0004781 | 1/2000 |
| KR | 1020060039659 A | 5/2006 |
| KR | 10-0729084 | 6/2007 |
| KR | 10-0759674 | 9/2007 |

OTHER PUBLICATIONS

Above reference is cited in the Notice of decision issued by Korean Patent Office on Aug. 19, 2009 in the corresponding Korean Patent Application No. 10-2007-0139025.

* cited by examiner

US 7,773,372 B2

ORGANIC LIGHT EMITTING DIODE DISPLAY

CLAIM OF PRIORITY

This application makes reference to, incorporates the same herein, and claims all benefits accruing under 35 U.S.C. §119 from an application for ORGANIC LIGHT EMITTING DIODE DISPLAY earlier filed in the Korean Intellectual Property Office on the 27 Dec. 2007 and there duly assigned Serial No. 10-2007-0139025.

BACKGROUND OF THE INVENTION

1. Field of the Invention

The present invention relates to an organic light emitting diode (OLED) display and, more particularly, to an OLED display having increased mechanical strength by improving the shape or the form of a bezel combined to a panel assembly.

2. Description of the Related Art

The OLED display includes organic light emitting elements including a hole injection electrode, an organic emission layer, and an electron injection electrode. The organic emission layer emits light by energy that is generated when excitons that are generated as electrons and holes are combined in the organic emission layer drop from an excited state to a base state.

Based on such principle, the OLED display has a self-luminous characteristic, and because the OLED display does not need a light source, unlike a liquid crystal display (LCD), it can have a relatively small thickness and weight. In addition, since the OLED display exhibits high-quality characteristics such as low power consumption, high luminance, a high response speed, etc., it is receiving much attention as a next-generation display device.

In general, the OLED display includes a panel assembly on which the organic light emitting elements are formed, a bezel combined on a rear side of the panel assembly, and a printed circuit board (PCB) electrically connected with the panel assembly via a flexible printed circuit board (FPCB). The FPCB bends toward a rear side of the bezel to allow the PCB to be positioned on the rear surface of the bezel.

The panel assembly includes a display area in which the organic light emitting elements are formed, and a pad area where pad electrodes are exposed and the FPCB is fixed. The bezel includes a bottom part on which the panel assembly is mounted, and a side wall formed at edges of the bottom part. In this case, the side wall is formed at edges, excluding an edge portion where the FPCB is folded, of the bottom part.

Unlike the LCD in which the interior of a panel assembly is filled with liquid crystal, the interior of the panel assembly of the OLED display has an empty space, so the OLED device has a low impact-resistance characteristic. In particular, because the side wall of the bezel is omitted at the portion where the FPCB is folded, distortion strength and bending strength of the portion of the bezel corresponding to the pad area are degraded.

Thus, if a user inadvertently drops an electronic device employing the OLED display while in use, a considerable distortion load or a considerable bending load would be instantly applied to the portion of the bezel corresponding to the pad area, thereby deforming the bezel. Then, the distortion load and the bending load would be transferred to the panel assembly, to which the bezel is combined, to damage the panel assembly.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an organic light emitting diode (OLED) display having advantages of increasing mechanical strength and impact-resistance characteristics by improving the shape of a bezel combined to a panel assembly.

An exemplary embodiment of the present invention provides an OLED display including a panel assembly having a display area and a pad area, and a bezel accommodating the panel assembly. The bezel includes a side wall provided on a side of the bezel, and a hemming flange provided on another side of the bezel on which the side wall is not provided, and a bottom part on which the panel assembly is mounted in a manner that the pad area is turned towards the another side.

The OLED display may further include a flexible printed circuit board (FPCB) coupled to the pad area and bending over to surround the hemming flange, and a PCB electrically connected with the FPCB.

The panel assembly may include a first substrate on which the pad area is formed, and an upper surface of the hemming flange may be positioned to be higher than an upper surface of the first substrate. The hemming flange may be formed to be bent at least twice toward an inner side of the bezel, and is positioned to be spaced apart from an edge of the first substrate.

The hemming flange may be bent at least three times toward an inside of the bezel, and includes a horizontal part that is substantially parallel to the bottom part.

The hemming flange may be formed by folding an edge portion of the bottom part toward an inside of the bezel, and includes a horizontal part that is substantially parallel to the bottom part.

The hemming flange may be formed by folding an edge portion of the bottom part toward an outside of the bezel, and includes a horizontal part that is substantially parallel to the bottom part.

The bezel may be made of metal.

The OLED display may further include an upper bezel that covers the pad area and is fixed to the panel assembly. The upper bezel may have the same size as the bottom part of the bezel, and includes an opening that exposes the display area. The upper bezel may be fixed to the panel assembly by means of a double-sided adhesive tape.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
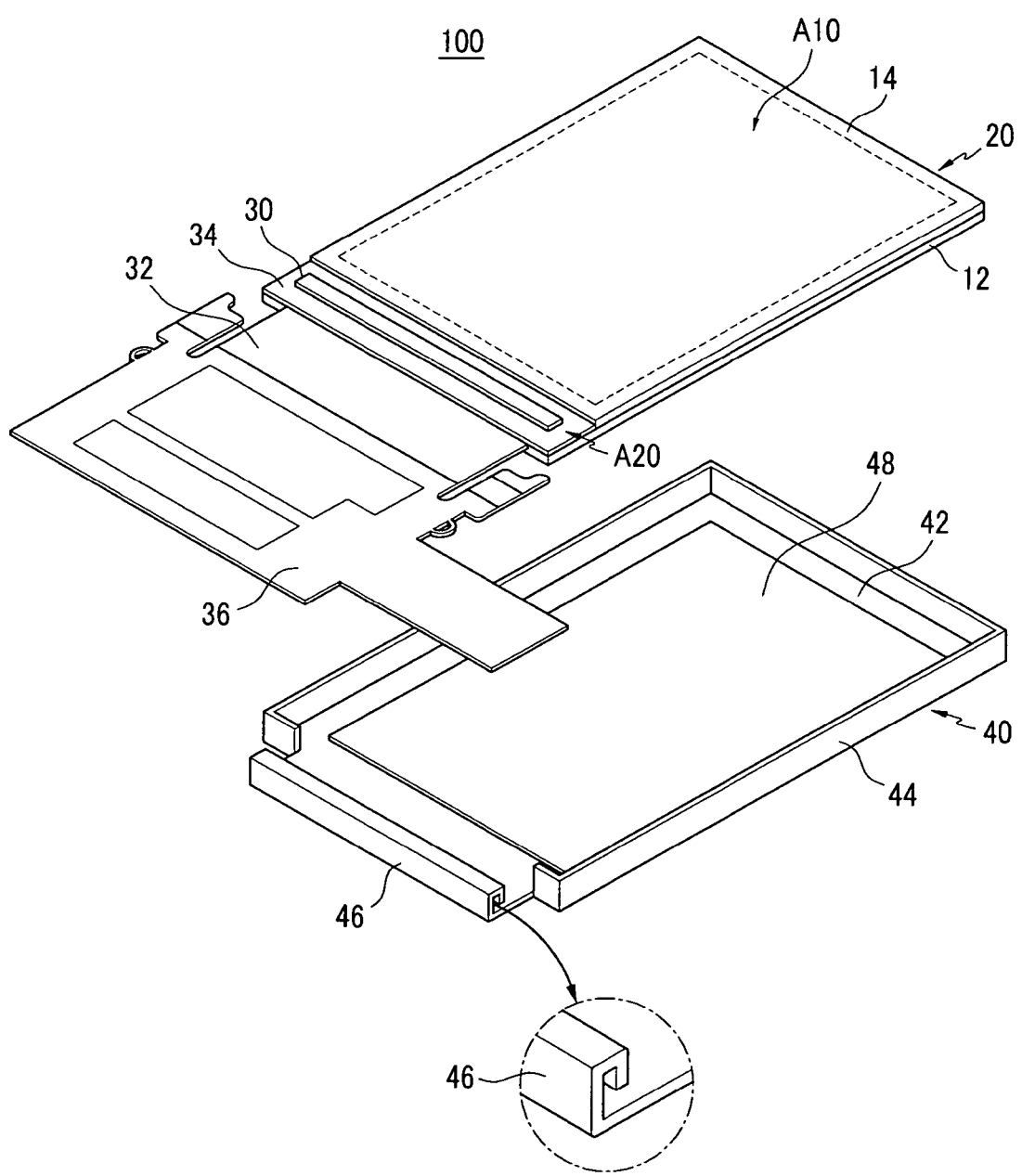
FIG. 1 is an exploded perspective view of an organic light emitting diode (OLED) display according to a first exemplary embodiment of the present invention.
Figure 2:
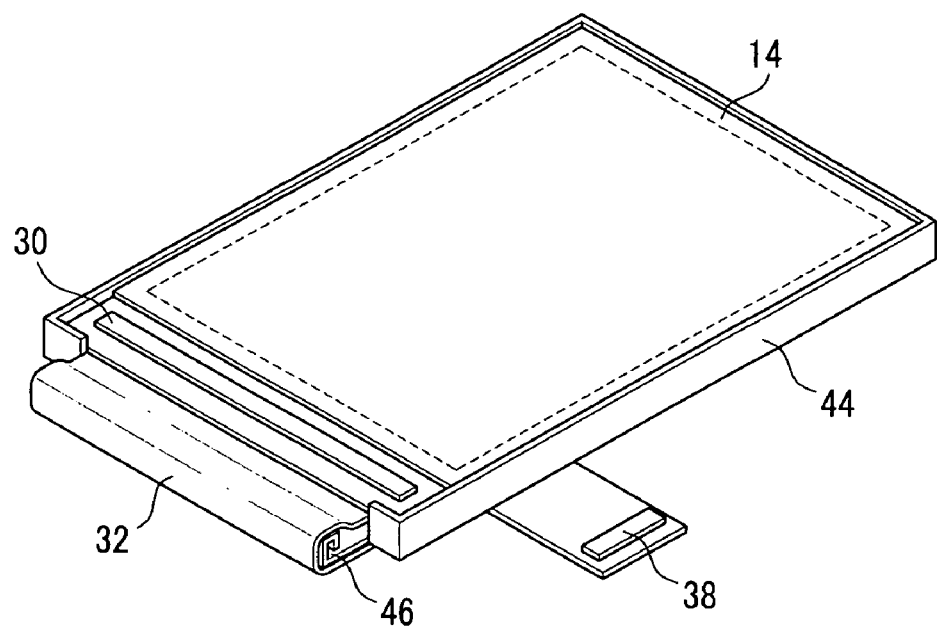
FIG. 2 is a perspective view showing an assembled state of the OLED display in FIG. 1.

FIG. 1 is an exploded perspective view of an organic light emitting diode (OLED) display according to a first exemplary embodiment of the present invention, and FIG. 2 is a perspective view showing an assembled state of the OLED display in FIG. 1.

With reference to FIGS. 1 and 2, an OLED display 100 of the first exemplary embodiment includes a panel assembly 20, which includes a display area A10 and a pad area A20, and displays a certain image on the display area A10, a bezel 40 disposed on a rear side of the panel assembly 20, and a printed circuit board (PCB) 36 electrically connected with the panel assembly 20 via a flexible printed circuit board (FPCB) 32.

The panel assembly 20 includes a first substrate 12 and a second substrate 14 having a smaller size than that of the first substrate 12. Edges of the second substrate 14 are fixed to the first substrate 12 by means of a sealant. The display area A10 is positioned inside an overlap area of the first and second substrates 12 and 14 at an inner side of the sealant, on which an image is actually displayed, and the pad area A20 is positioned on the first substrate 12 at an outer side of the sealant.

Sub-pixels are arranged in a matrix form at the display area A10 of the first substrate 12, and a scan driver (not shown) and a data driver (not shown) for driving the sub-pixels are positioned between the display area A10 and the sealant or at an outer side of the sealant. Pad electrodes (not shown) for transferring electrical signals to the scan driver and the data driver are positioned at the pad area A20 of the first substrate 12.

Figure 3:
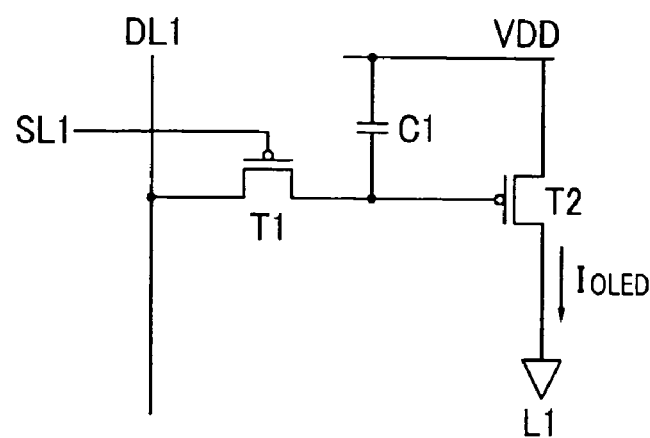
FIG. 3 is a schematic diagram showing a circuit structure of a sub-pixel of a panel assembly in FIG. 1.
Figure 4:
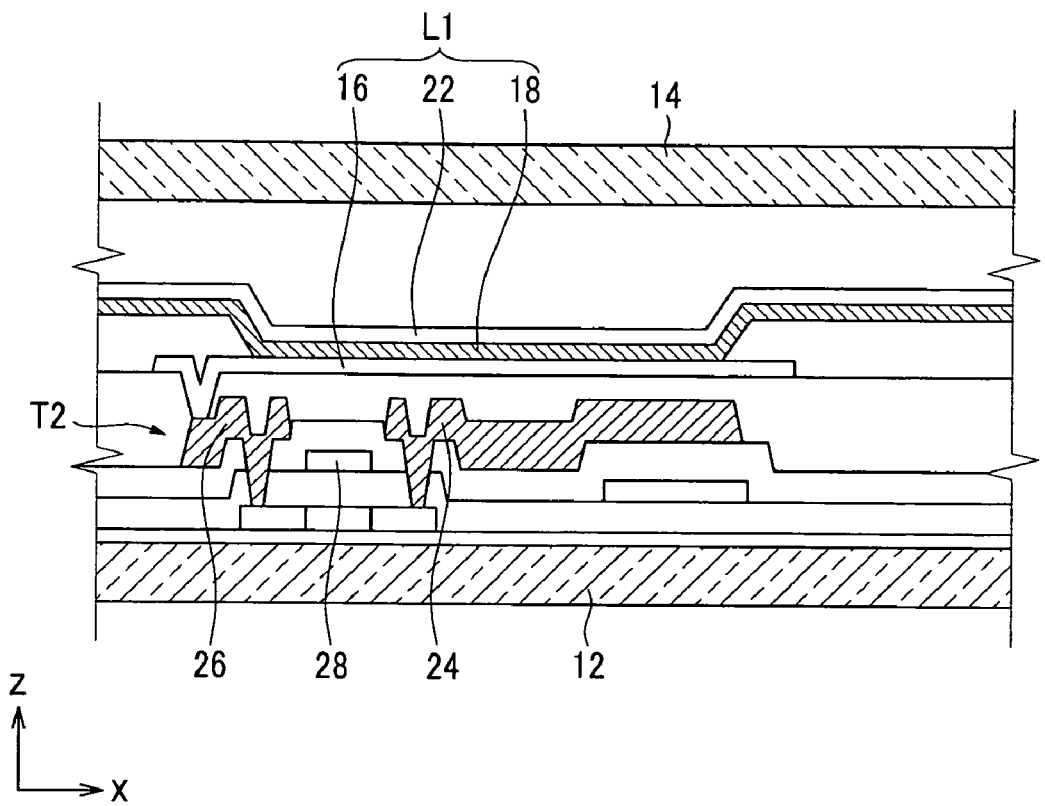
FIG. 4 is a partially enlarged cross-sectional view of the panel assembly in FIG. 1.

FIG. 3 is a schematic diagram showing a circuit structure of a sub-pixel of a panel assembly in FIG. 1, and FIG. 4 is a partially enlarged cross-sectional view of the panel assembly in FIG. 1.

With reference to FIGS. 3 and 4, each sub-pixel of the panel assembly 20 includes an organic light emitting element L1 and a driving circuit unit. The organic light emitting element L1 includes an anode electrode 16, an organic emission layer 18, and a cathode electrode 22. The driving circuit unit includes at least two thin film transistors (TFTs) and a single storage capacitor C1. The TFTs basically include a switching transistor T1 and a driving transistor T2.

The switching transistor T1 is connected with a scan line SL1 and a data line DL1, and transmits a data voltage inputted from the data line DL1 to the driving transistor T2 according to a switching voltage inputted to the scan line SL1. The storage capacitor C1 is connected with the switching transistor T1 and a power source line VDD, and stores a voltage corresponding to a difference between a voltage received from the switching transistor T1 and a voltage supplied to the power source line VDD.

The driving transistor T2 is connected with the power source line VDD and the storage capacitor C1, and supplies an output current $I_{OLED}$ that is proportional to the square of a difference between the voltage stored in the storage capacitor C1 and a threshold voltage to the organic light emitting element L1. The organic light emitting element L1 emits light by being controlled by the output current $I_{OLED}$. The driving transistor T2 includes a source electrode 24, a drain electrode 26, and a gate electrode 28, and the anode electrode 16 of the organic light emitting element L1 may be connected with the drain electrode 26 of the driving transistor T2. The configuration of the sub-pixel may be modified variably without being limited to the above-described exemplary configuration.

With reference back to FIGS. 1 and 2, the second substrate 14 is bonded with the first substrate 12 by the sealant with a certain interval therebetween to seal and protect the driving circuit units and the organic light emitting elements formed on the first substrate 12 against the exterior. The second substrate 14 may be an upper substrate of the panel assembly 20, and a moisture absorbent (not shown) may be attached on an inner surface of the second substrate 14.

On the pad area A20 of the panel assembly 20, an integrated circuit (IC) chip 30 may be mounted in a chip-on-glass (COG) manner, and the flexible printed circuit board (FPCB) 32 is mounted in a chip-on-film (COF) manner. A protective layer 34 is formed in the vicinity of the IC chip 30 and the FPCB 32 to cover and protect the pad electrodes formed on the pad area A20.

On the PCB 36, electronic elements (not shown) for processing driving signals are mounted, and a connector 38 for transmitting an external signal to the PCB 36 is installed thereto. The FPCB 32 that is coupled to the pad area A20 bends over toward a rear side of the bezel 40 to allow the PCB 36 to be positioned on a rear surface of the bezel 40.

The bezel 40 according to the present exemplary embodiment includes a bottom part 42 on which the panel assembly 20 is mounted, a side wall 44 provided on a side of the bezel 40. The side wall 44 is positioned on edges of the bottom part 42, excluding an edge portion of the bottom part 42 where the FPCB 32 is folded, and a hemming flange 46 provided on a side of the bezel 40 on which the side wall 44 is not provided. The hemming flange 46 is positioned at the edge portion of the bottom part 42 where the FPCB 32 is folded. The side wall 44 extends from the edges of the bottom part 42 toward the panel assembly 20 to face the side of the panel assembly 20. Therefore, the bezel 40 accommodates the panel assembly 20.

The bezel 40 may be made of a metallic material with high rigidity such as stainless steel, cold rolled steel, aluminum, an aluminum alloy, a nickel alloy, and the like. The bezel 40 may be completed by standing the side wall 44 and folding the hemming flange 46 from the bottom part 42 through a known hemming process. A double-sided tape 48 may be positioned between the bottom part 42 of the bezel 40 and the panel assembly 20 to fix the panel assembly 20 to the bezel 40.

The bezel 40 is disposed on a rear side of the panel assembly 20 to support the panel assembly 20. In the present exemplary embodiment, the hemming flange 46 is formed at a portion that is mechanically weak, because the side wall 44 is not provided. That is, the hemming flange 46 is formed at the edge portion of the bottom part 42 of the bezel 40 where the FPCB 32 is folded, in order to increase strength of the bezel 40 against distortion and bending.

Figure 5:
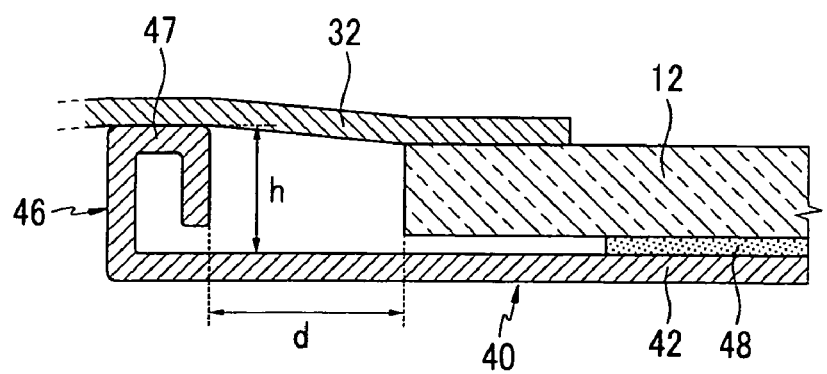
FIG. 5 is a partially enlarged cross-sectional view of a bezel and a flexible printed circuit board (FPCB) in FIG. 1.

FIG. 5 is a partially enlarged cross-sectional view of the bezel and the FPCB in FIG. 1. With reference to FIGS. 1 and 5, the hemming flange 46 is formed with extension of the bottom part 42 that extends beyond the bezel 40, and has a structure in which it is bent twice or more times toward an inside of the bezel 40. FIGS. 1 and 5 show the case where the hemming flange 46 is bent from the bottom part three times, and in this case, the hemming flange 46 includes a horizontal portion 47 that is substantially parallel to the bottom part 42.

The hemming structure is a structure wherein an end portion of a plate material is folded or bent, and therefore increasing mechanical strength of a product. Thus, because the hemming flange 46 increases the mechanical strength at the portion of the bezel 40 corresponding to the pad part A20, deformation of the bezel 40 that may be caused by an external force, and particularly by a dropping impact, can be reduced.

In the present exemplary embodiment, an upper surface of the hemming flange 46 maybe positioned to be higher than that of the first substrate 12 on which the FPCB 32 is fixed. In FIG. 5, the overall height of the hemming flange 46 is indicated as "h". In this case, the hemming flange 46 is positioned to be spaced apart by a certain distance (see "d" in FIG. 5) from an edge of the first substrate 12.

Thus, when the FPCB 32 that is fixed on the first substrate 12 is folded toward the rear side of the bezel 40 while surrounding the hemming flange 46, the FPCB 32 can be restrained from coming off upwardly by being suddenly bent by the hemming flange 46. As a result, the FPCB 32 can be prevented from being damaged when the panel assembly 20 and the bezel 40 are assembled. In addition, owing to the structure of the hemming flange 46, the horizontal portion 47 of the hemming flange 46, rather than a sharp corner portion of the hemming flange 46, contacts the FPCB 32. Thus, in the present exemplary embodiment, a chamfering process for smoothly chamfering corners of the bezel 40 to restrain damage of the FPCB 32 can be omitted.

Figure 6:
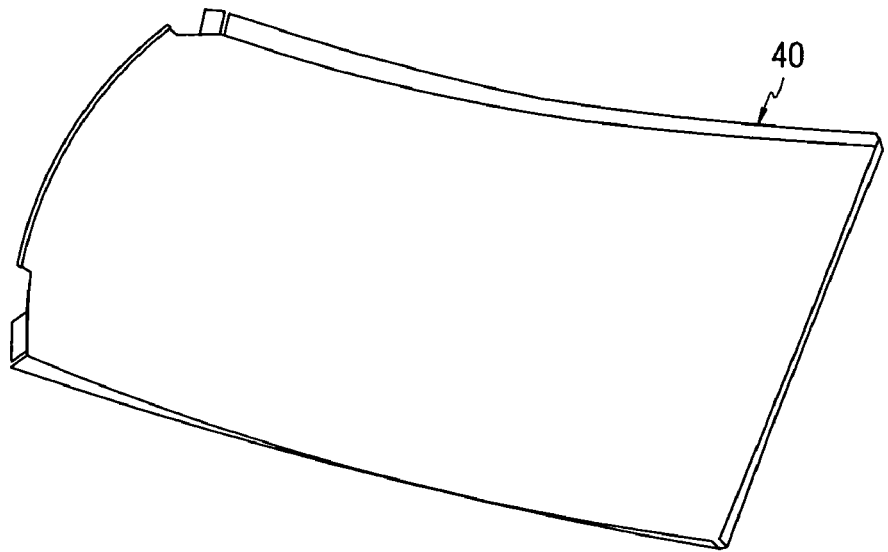
FIG. 6 is a drawing illustrating the simulation result of deformation of the bezel in FIG. 1 caused by an impact when dropped.
Figure 7:
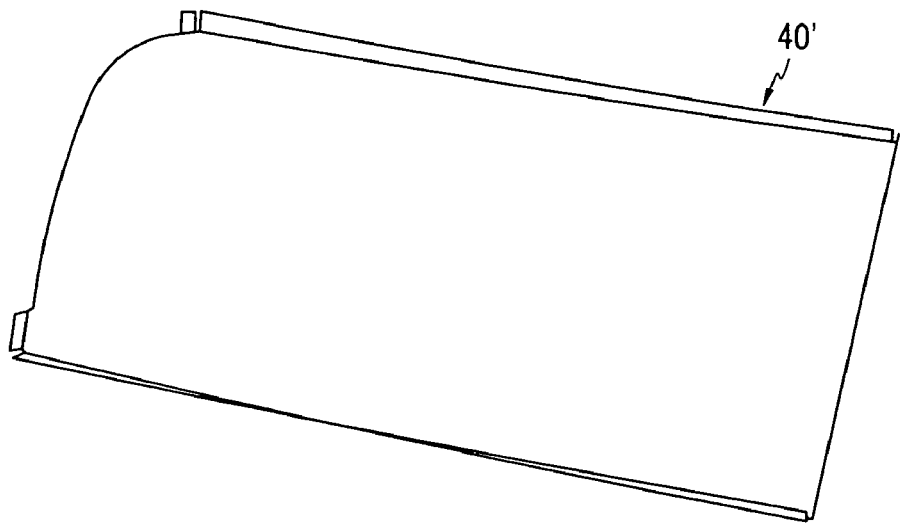
FIG. 7 is a drawing illustrating the simulation result of deformation of a bezel without a hemming flange caused by an impact when dropped according to a comparative example.

FIG. 6 is a drawing illustrating the simulation result of deformation of the bezel in FIG. 1 caused by an impact when dropped, and FIG. 7 is a drawing illustrating the simulation result of deformation of a bezel without a hemming flange caused by an impact when dropped according to a comparative example.

With reference to FIGS. 6 and 7, it can be noted that a portion (a left portion in FIG. 7) of a bezel 40' corresponding to the pad area that does not have the hemming flange according to the comparative example was drastically bent with a sharp curved line under the same dropping experimental conditions. In contrast, as for the bezel 40 having the hemming flange according to the present exemplary embodiment, it can be noted that the portion of the bezel 40 (a left portion in FIG. 6) corresponding to the pad area was slightly bent with a gentle curved line, having a smaller amount of deformation compared with that of the comparative example.

In this manner, in the OLED display 100 of the present exemplary embodiment, the same rigidity can be provided to the entire bezel 40 by the hemming flange 46 to thus reduce the degree of deformation of the bezel 40 when an impact, such as dropping, is applied. Accordingly, a distortion load and a bending load applied from the bezel 40 to the panel assembly 20 can decrease to thus prevent damage of the panel assembly 20.

A dropping test was conducted as follows. The OLED 100 of the first exemplary embodiment and the OLED display that does not have a hemming flange, which was prepared as a comparative example, were mounted in dropping jigs, respectively, and the dropping jigs were dropped to determine whether or not the panel assembly 20 was damaged.

Figure 8:
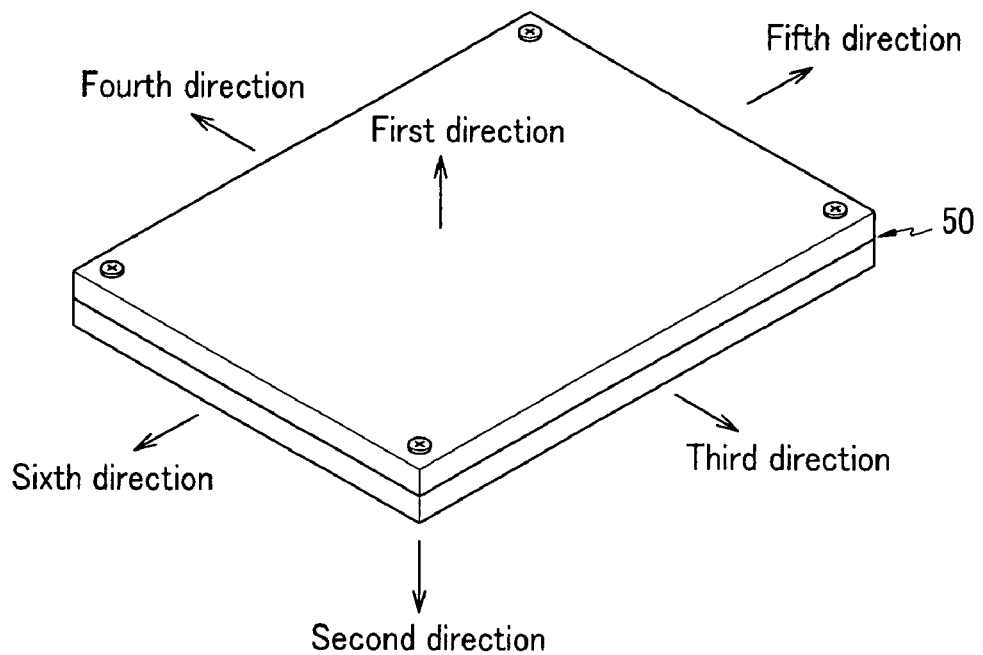
FIG. 8 is a schematic view showing a dropping jig used for a dropping test.

A dropping height of the dropping jigs was 1.5 m, and the dropping jigs were oriented in six different ways, as indicated by arrows (first to sixth directions) in FIG. 8, to be dropped on the ground. The dropping jig 50 was dropped three times in each direction to determine whether the panel assembly was damaged.

Figure 9:
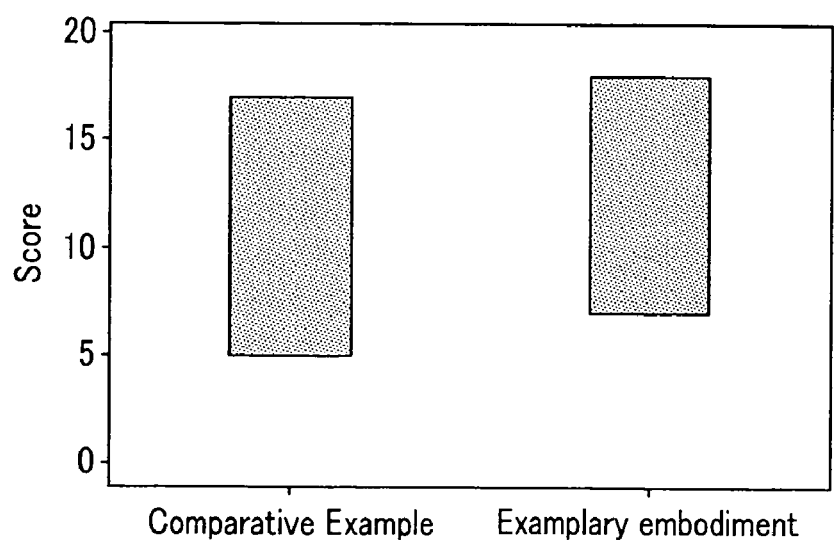
FIG. 9 is a graph showing dropping scores of the OLED display according to the first exemplary embodiment as shown in FIG. 1 and an OLED display according to the comparative example without a hemming flange.

FIG. 9 is a graph showing the dropping scores of the OLED display of the first exemplary embodiment as shown in FIG. 1 and the OLED display of the comparative example without a hemming flange. In FIG. 9, the dropping scores in a vertical axis were obtained as follows. A good result was scored as 1 and a bad result was scored as 0, and the dropping scores of a total of eighteen times (dropping was performed three times in the six directions) were added.

Table 1 shows average dropping scores, experimental standard deviations, and good result rate of the OLED display of the first exemplary embodiment and that of the comparative example.

TABLE 1

|  | Average dropping score | Experimental standard deviation | Good result rate (%) |
|---|---|---|---|
| Comparative example | 9.47 | 5.96 | 16.7 |
| Exemplary embodiment | 13.60 | 5.19 | 50.0 |

As shown in Table 1, the OLED display of the comparative example exhibited an average dropping score of 9.47, an experimental standard deviation of 5.96, and a low good result rate of 16.7%. In contrast, it can be noted that the OLED having the hemming flange according to the present exemplary embodiment exhibited an average dropping score of 13.6, an experimental standard deviation of 5.19, and a high good result rate of 50.0%.

Figure 10:
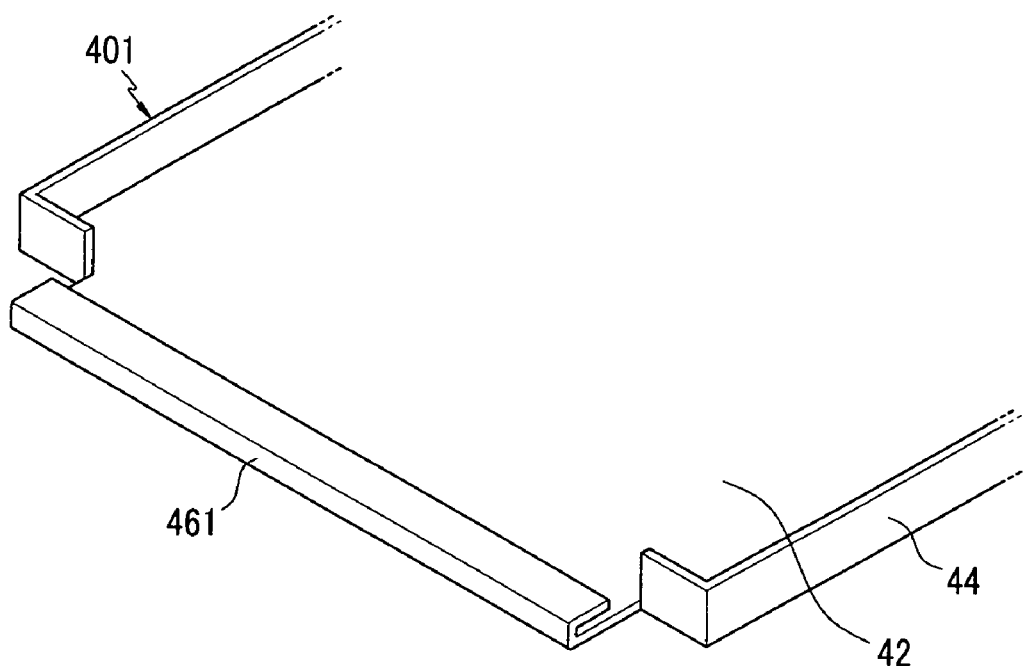
FIG. 10 is an enlarged perspective view showing a portion of a bezel of an OLED display according to a second exemplary embodiment of the present invention.
Figure 11:
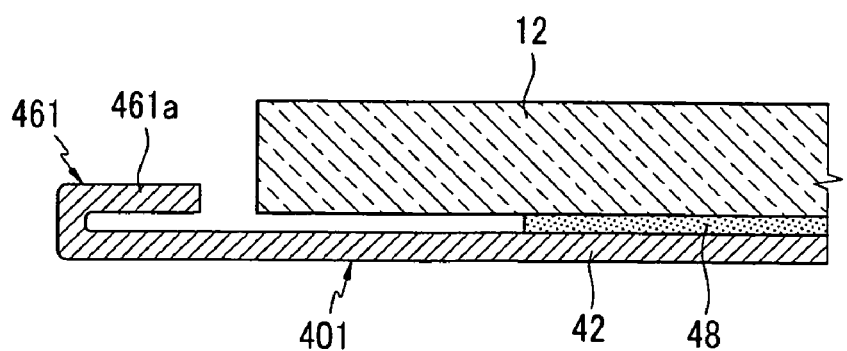
FIG. 11 is a partially enlarged cross-sectional view of the OLED display having the bezel in FIG. 10.

FIG. 10 is an enlarged perspective view showing a portion of a bezel of an OLED display according to a second exemplary embodiment of the present invention, and FIG. 11 is a cross-sectional view of the bezel in FIG. 10, showing portions of the first substrate and a double-sided tape.

With reference to FIGS. 10 and 11, a bezel 401 of the OLED display of the second exemplary embodiment has a similar configuration as that in the first exemplary embodiment of the present invention, except that a hemming flange 461 is formed to be folded toward an inner side of the bezel 401, and has a height lower than the upper surface of the first substrate 12. The same reference numerals are used for the same elements as those in the first exemplary embodiment of the present invention.

The hemming flange 461 may be bent by around 180° from the bottom part 42 to have a horizontal part 461a parallel to the bottom part 42. The hemming flange 461 of the present exemplary embodiment is formed by the smaller number of bends than the hemming flange in the first exemplary embodiment of the present invention, so the bezel 401 can be more easily fabricated. The hemming flange 461 of the present exemplary embodiment increases mechanical strength of the bezel 401 to thus reduce deformation that may be caused by a possible dropping impact.

Figure 12:
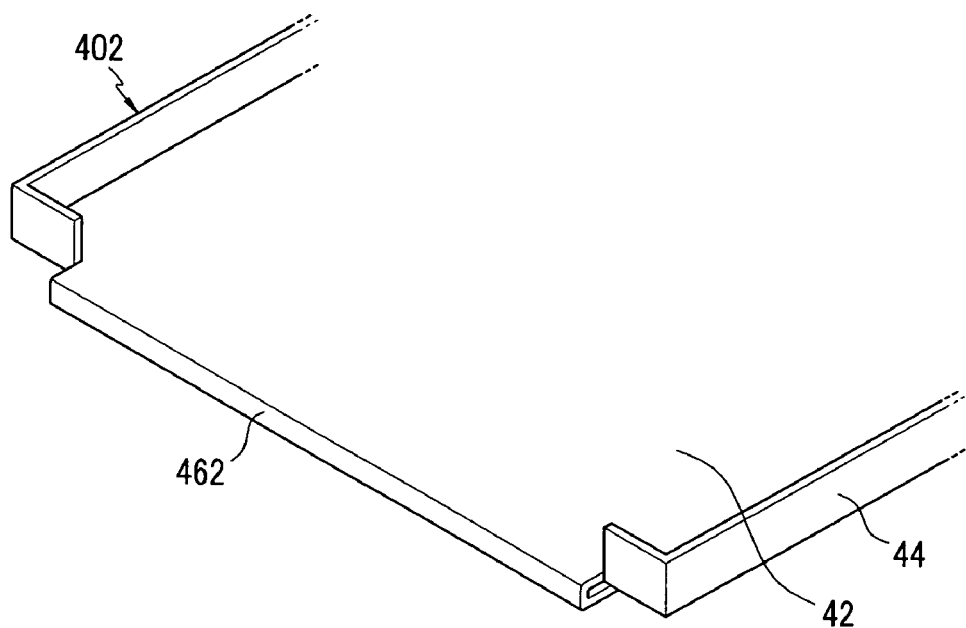
FIG. 12 is an enlarged perspective view showing a portion of a bezel of an OLED display according to a third exemplary embodiment of the present invention.
Figure 13:
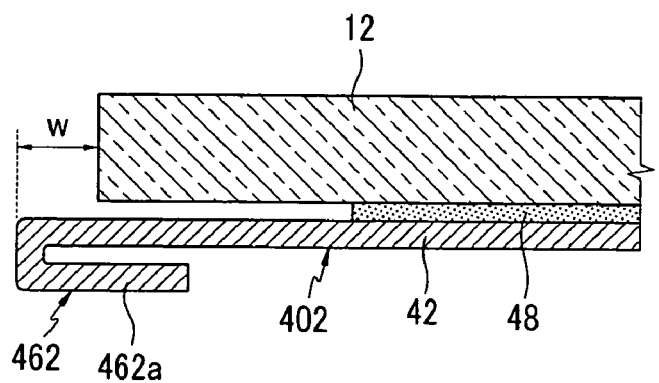
FIG. 13 is a partially enlarged cross-sectional view of the OLED display having the bezel in FIG. 12.

FIG. 12 is an enlarged perspective view showing a portion of a bezel of an OLED display according to a third exemplary embodiment of the present invention, and FIG. 13 is a cross-sectional view of the bezel in FIG. 12, showing portions of the first substrate and a double-sided tape.

With reference to FIGS. 12 and 13, a bezel 402 of the OLED display of the third exemplary embodiment of the present invention has a similar configuration as that in the first exemplary embodiment of the present invention, except that a hemming flange 462 has such a structure that the hemming flange 462 is folded once toward an outer side of the bezel 402, that is, toward a lower surface of the bottom part 42. The same reference numerals are used for the same elements as those in the first exemplary embodiment of the present invention.

The hemming flange 462 may be bent by around 180° from the bottom part 42 to have a horizontal part 462a parallel to the bottom part 42. Because the hemming flange 462 of the present exemplary embodiment is folded toward the outer side rather than an inner side of the bezel 402, the width ("w" in FIG. 13), by which the hemming flange 462 protrudes from the end of the first substrate 12, can be reduced to make the bezel 402 more compact. The hemming flange 462 of the present exemplary embodiment can also increase mechanical strength of the bezel 402 to reduce deformation that may be caused by a dropping impact.

Figure 14:
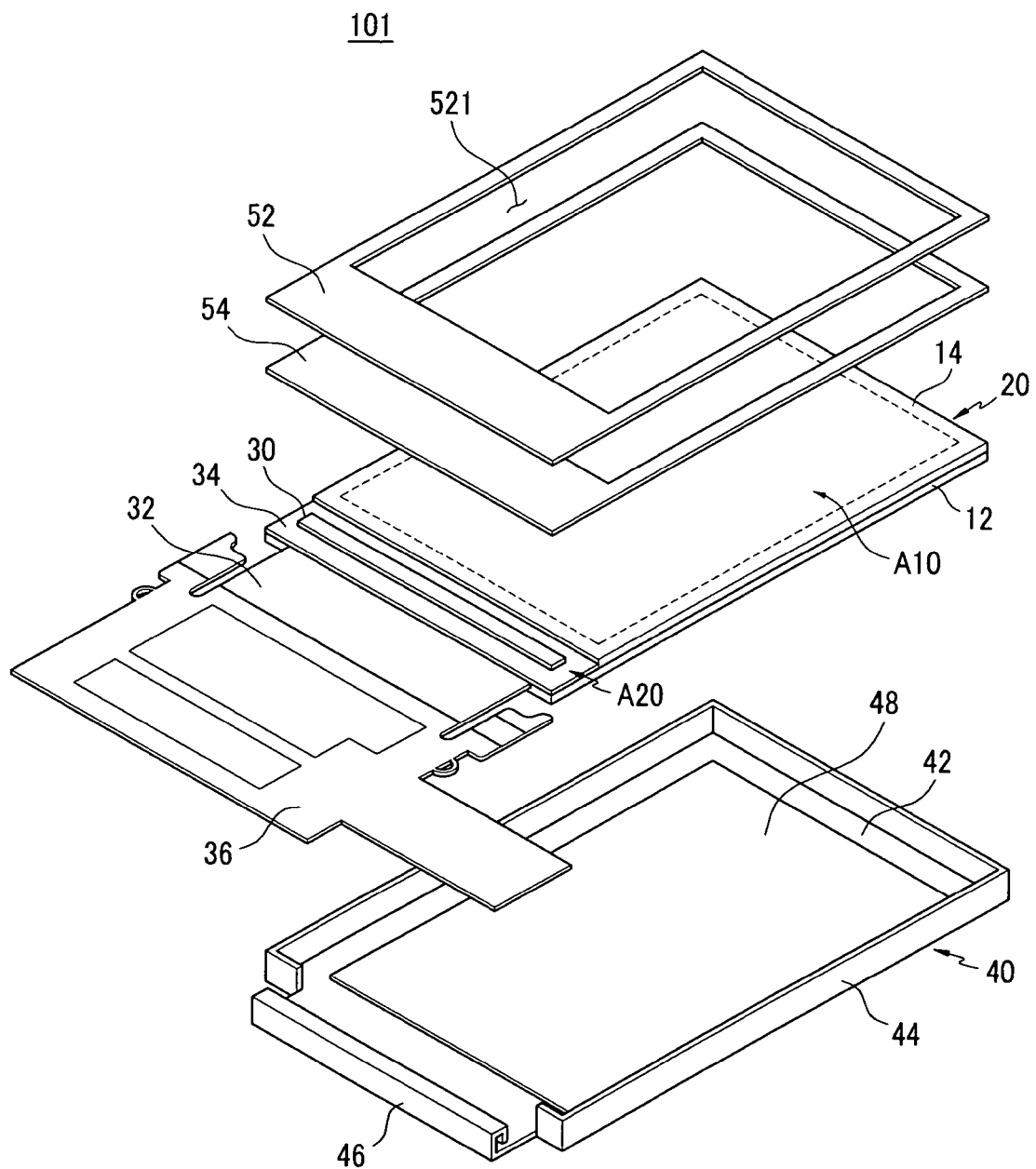
FIG. 14 is an exploded perspective view of an OLED display according to a fourth exemplary embodiment of the present invention.
Figure 15:
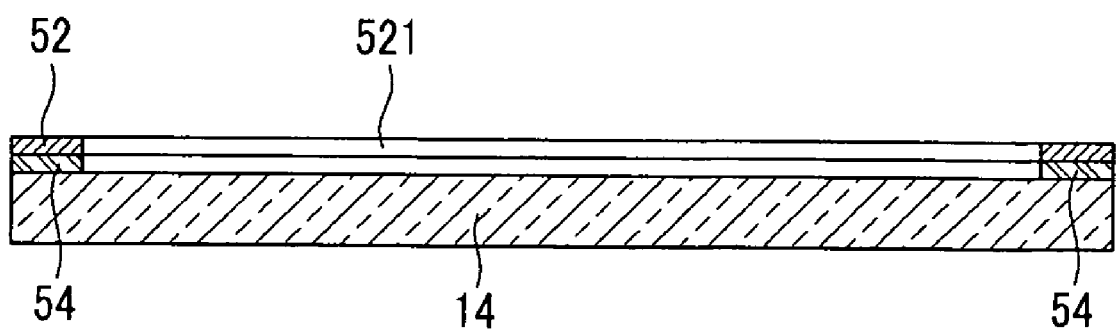
FIG. 15 is a sectional view showing a combined state of a second substrate and an upper bezel in FIG. 14.

FIG. 14 is an exploded perspective view of an OLED display according to a fourth exemplary embodiment of the present invention, and FIG. 15 is a sectional view showing a combined state of a second substrate and an upper bezel in FIG. 14.

With reference to FIGS. 14 and 15, an OLED display 101 of the fourth exemplary embodiment includes an upper bezel 52 coupled to a front surface of the panel assembly 20 in addition to a lower bezel 40 positioned on a rear side of the panel assembly 20. The lower bezel 40 has the same shape as that of one in the first to third exemplary embodiments of the present invention as described above. FIG. 14 shows, for example, the lower bezel 40 of the first exemplary embodiment.

The upper bezel 52 has substantially the same size as the first substrate 12 of the panel assembly 20 and as the bottom part 42 of the lower bezel 40, and includes an opening 521 that exposes the display area A10. The upper bezel 52 has a plate shape with a certain thickness, and may be attached on an upper surface of the second substrate 14 by using a double-sided tape 54.

Because the upper bezel 52 of the OLED display 101 according to the present exemplary embodiment can cover and protect the pad area A20 of the panel assembly 20, it can effectively contribute to increasing mechanical strength of the pad area A20 together with the lower bezel 40.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   a panel assembly having a display area and a pad area; and
   a bezel accommodating the panel assembly, the bezel comprising:
      a side wall provided on a side of the bezel;
      a hemming flange provided on another side of the bezel on which the side wall is not provided; and
      a bottom part on which the panel assembly is mounted in a manner that the pad area is turned towards the another side.

2. The OLED display of claim 1, further comprising:
   a flexible printed circuit board coupled to the pad area and bending over to surround the hemming flange; and
   a PCB electrically connected to the flexible printed circuit board.

3. The OLED display of claim 1, wherein the panel assembly comprises a first substrate on which the pad area is formed, and an upper surface of the hemming flange is positioned to be higher than an upper surface of the first substrate.

4. The OLED display of claim 3, wherein the hemming flange is formed to be bent at least twice toward an inside of the bezel.

5. The OLED display of claim 3, wherein the hemming flange is positioned to be spaced apart from an edge of the first substrate.

6. The OLED display of claim 1, wherein the hemming flange is formed to be bent at least three times toward an inside of the bezel.

7. The OLED display of claim 6, wherein the hemming flange comprises a horizontal part that is substantially parallel to the bottom part.

8. The OLED display of claim 1, wherein the hemming flange is formed by folding an edge portion of the bottom part toward an inside of the bezel.

9. The OLED display of claim 8, wherein the hemming flange includes a horizontal part that is substantially parallel to the bottom part.

10. The OLED display of claim 1, wherein the hemming flange is formed by folding an edge portion of the bottom part toward an outside of the bezel.

11. The OLED display of claim 10, wherein the hemming flange includes a horizontal part that is substantially parallel to the bottom part.

12. The OLED display of claim 1, wherein the bezel is made of metal.

13. The OLED display of claim 1, further comprising:
   an upper bezel that covers the pad area and is fixed to the panel assembly.

14. The OLED display of claim 13, wherein the upper bezel is substantially the same size as the bottom part of the bezel, and includes an opening that exposes the display area.

15. The OLED display of claim 13, wherein the upper bezel is fixed to the panel assembly by means of a double-sided adhesive tape.

* * * * *